United States Patent [19]

Dantzig et al.

[11] Patent Number: 4,561,489
[45] Date of Patent: Dec. 31, 1985

[54] FLUX CONCENTRATOR

[75] Inventors: Jonathan A. Dantzig, Hamden; John V. Patton, New Haven, both of Conn.

[73] Assignee: Olin Corporation, New Haven, Conn.

[21] Appl. No.: 692,135

[22] Filed: Jan. 17, 1985

Related U.S. Application Data

[62] Division of Ser. No. 361,940, Mar. 25, 1982, Pat. No. 4,522,790.

[51] Int. Cl.$^4$ ............................................... B22D 27/02
[52] U.S. Cl. ...................................... 164/467; 164/498
[58] Field of Search ............. 164/467, 503, 498, 147.1

[56] References Cited

U.S. PATENT DOCUMENTS

| | | |
|---|---|---|
| 3,096,158 | 7/1963 | Gaule et al. |
| 3,467,166 | 9/1969 | Getselev et al. |
| 3,605,865 | 10/1971 | Getselev. |
| 3,607,138 | 9/1971 | Keller .................................. 156/620 |
| 3,985,179 | 10/1976 | Goodrich et al. ................... 164/503 |
| 4,161,206 | 7/1979 | Yarwood et al. |
| 4,220,839 | 9/1980 | Leon .................................... 156/620 |
| 4,325,777 | 4/1982 | Yarwood et al. ................... 156/620 |
| 4,358,416 | 11/1982 | Yarwood et al. |
| 4,373,571 | 2/1983 | Yarwood et al. ................... 164/503 |
| 4,434,838 | 3/1984 | Sevier. |
| 4,441,542 | 4/1984 | Pryor et al. |

OTHER PUBLICATIONS

National Technical Information Service Report PB-248,963, "Scale-Up of Program on Continuous Silicon Solar Cells", by A. D. Morrison, Sep., 1975.

"The Role of Surface Tension in Pulling Single Crystals of Controlled Dimensions", by G. K. Gaule et al., *Metallurgy of Elemental and Compound Semiconductors*, Interscience Publishers, Inc., New York, 1961, pp. 201-226.

*Induction Heating Handbook*, Davies and Simpson, McGraw-Hill Book Co., UK, Limited, England, 1979, pp. 93-95 and 100.

"Flux Concentration by Stationary Conductors", Howland and Foner, in *High Magnetic Fields*, Proceedings of Internaltional Conference on High Magnetic Fields, MIT Press and John Wiley and Sons, New York, New York, 1962, pp. 249-257.

*Primary Examiner*—Kuang Y. Lin
*Attorney, Agent, or Firm*—Howard M. Cohn; Barry L. Kelmachter; Paul Weinstein

[57] ABSTRACT

A flux concentrator is disclosed for generating a strong magnetic field. An inductor is provided for generating a primary magnetic field which is weaker than the strong magnetic field. A concentrator body has a hollow interior for receiving material to be acted upon by the strong magnetic field. The body is located within the primary magnetic field and shields the primary magnetic field from the hollow interior. A flux concentrator device is positioned within the hollow interior and has a slot extending therethrough. The flux concentrator device is coupled to the primary field for generating the strong magnetic field within the slot. Structure is provided to vary the size of the slot while the strong magnetic field is being generated in the slot.

6 Claims, 6 Drawing Figures

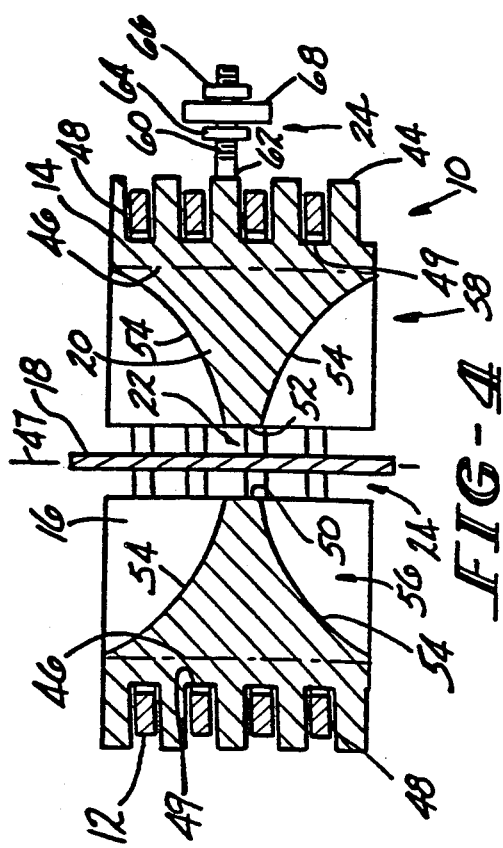

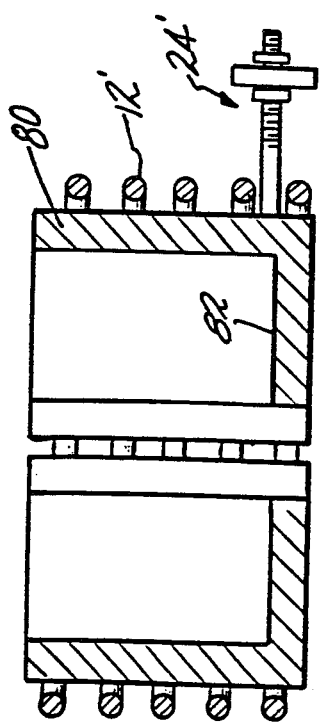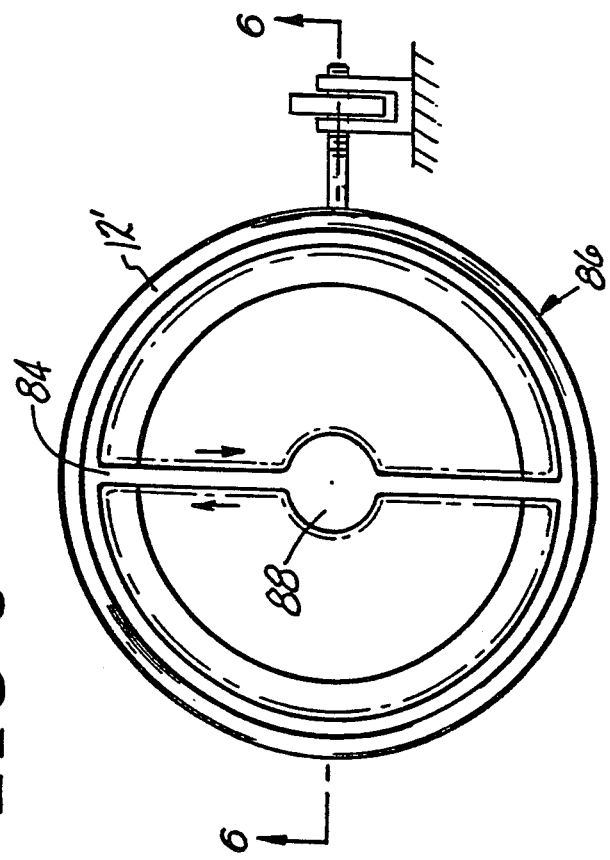

FLUX CONCENTRATOR

This application is a division of U.S. patent application Ser. No. 361,940, filed Mar. 25, 1982, now U.S. Pat. No. 4,522,790 by Jonathan A. Dantzig et al., for AN IMPROVED FLUX CONCENTRATOR.

While the invention is subject to a wide range of applications, it is especially suited for electromagnetic casting of strip material and will be particularly described in that connection. The process and apparatus preferably operate by varying the size of a casting zone while a strong magnetic field is simultaneously being generated within the casting zone.

Electromagnetic devices such as single or multiturn coils have been used for containing and shaping conducting molten material. In conjunction with these coils, prior art concentrators have successfully focused magnetic flux to form many casting shapes. However, the construction of a concentrator to form both very thin and very wide ribbon requires costly, precision machining. Further, the casting process requires the material to pass through an extremely narrow slot which results in difficult startup conditions. The solution to these problems and other advantages over the prior art are provided by the present invention.

A variety of processes form semi-conductive materials such as silicon into a thin strip shape. Examples of such approaches can be found in National Technical Information Service Report PB-248,963, "Scale-Up of Program on Continuous Silicon Solar Cells" by A. D. Morrison, published in Sept. 1975, and in a paper entitled "The Role of Surface Tension in Pulling Single Crystals of Controlled Dimensions" by G. K. Gaule et al., *Metallurgy of Elemental and Compound Semiconductors*, published by Interscience Publishers, Inc., New York in 1961, pages 201–226. The Morrison and Gaule et al. publications are exemplary of pulling strip-type materials from a melt of silicon. Gaule et al. disclose a concentrator carrying a radio-frequency current. The concentrator surrounds the molten material and generates inward-directed pressure to shape the surface of the molten material. (See FIG. 5 on page 208.) The concentrator may also be used with guides to shape the corners of the thin, flat crystal as shown in FIG. 8. Gaule et al.'s concentrators are used with the Czochralski method of pulling single crystals from a melt of semi-conductor material.

The design and use of concentrators are described in *Induction Heating Handbook*, Davies and Simpson, McGraw-Hill Book Co., UK, Limited, England 1979, pages 93–95 and 100.

Another detailed report on flux concentrators which are particularly relevant to the present invention is entitled "Flux Concentration by Stationary Conductors", Howland and Foner, in *High Magnetic Fields*, Proceedings of International Conference on High Magnetic Fields, MIT Press and John Wiley and Sons, New York, New York, 1962, pages 249–257.

U.S. Pat. No. 3,096,158 to Gaule et al. discloses, for example, "indirect means for controlling the shape of the forming crystal without affecting the single-crystal structure thereof and without introducing any contamination therein. The physical pressure required to control the width or the thickness of the growing flat crystal is obtained electromagnetically from a specially designed radio-frequency induction coil. The geometrical shape of the coil and the frequency of the R-F current circulating therein determines the direction and magnitude of the applied pressure on the flat surfaces of the forming crystal."

In U.S. Pat. No. 4,353,408, to by M. J. Pryor, an electromagnetic thin strip casting apparatus and process are described for forming thin strip castings of a variety of materials including semi-conductive materials such as silicon. A specially-shaped inductor is utilized for containing a funnel-shaped pool of molten material and for forming the material into the desired thin strip shape. The process can be carried out continuously or semi-continuously as desired. A second portion of this electromagnetic casting apparatus is an inductor which has a relatively long containment zone of narrow cross section.

U.S. patent application Ser. No. 158,040, filed June 9, 1980 by J. Winter, (now abandoned), discloses an electromagnetic thin strip reforming apparatus and process for forming thin strip castings of a variety of materials. An input device conveys the starting strip of material to the electromagnetic apparatus to form the floating molten zone and an output device conveys thin strip of the material away from the electromagnetic device.

In U.S. patent application Ser. No. 213,125, filed Dec. 4, 1980 by J. C. Yarwood et al., (now abandoned), the disclosed apparatus has a first portion for electromagnetically containing and forming molten material into a cross-sectional shape substantially the same as the desired resulting thin strip shape. A second portion receives the molten material in the thin strip shape from the first portion and reduces the bulging in the cross-sectional shape due to surface tension. The second portion provides an electromagnetic field having a reduced strength as compared to the strength of the electromagnetic field in the first portion.

U.S. Pat. No. 4,373,511 to J. C. Yarwood et al. discloses, for example, "a concentrator device for reducing an electromagnetic field to establish the containment zone".

A considerable body of art has developed regarding electromagnetic containment for casting metals. The electromagnetic casting apparatus generally comprises a three-part mold consisting of a water cooled inductor, a non-magnetic screen, and a manifold for applying cooling water to the casting. Such an apparatus is exemplified in U.S. Pat. No. 3,467,166 to Getselev et al. The molten metal is contained without the molten metal directly contacting any mold component. Direct application of the cooling water to the solidifying shell of the casting solidifies the molten material. An elaborate discussion of the prior art relating to electromagnetic casting is found in U.S. Pat. No. 4,161,206 to Yarwood et al. and incorporated by reference herein.

Non-magnetic screens, typically utilized to properly shape the magnetic field for containing the molten metal, are exemplified by U.S. Pat. No. 3,605,865 to Getselev. The latter patent discloses an electromagnetic screen with upwardly-directed thickening; then, the rate of attenuation of the magnetic field is increased upwardly.

It is a problem underlying the present invention to provide an apparatus and process generating a strong magnetic field in a narrow, variably-sized passageway.

It is an advantage of the present invention to provide a flux concentrator for generating a strong magnetic field which substantially obviates one or more of the limitations and disadvantages of the described prior arrangements.

It is a further advantage of the present invention to provide a flux concentrator for generating a strong magnetic field within a narrow containment zone to form molten material.

It is a still further advantage of the present invention to provide a flux concentrator for generating a strong magnetic field providing reduced power consumption and relatively inexpensive operation.

It is a yet further advantage of the present invention to provide a flux concentrator for generating a strong magnetic field which is relatively inexpensive to manufacture.

It is another advantage of the present invention to provide a flux concentrator for generating a strong magnetic field which is capable of casting very thin and wide ribbon.

Accordingly, there has been provided a flux concentrator for generating a strong magnetic field. An inductor is provided for generating a primary magnetic field which is weaker than the strong magnetic field. A concentrator body has a hollow interior for receiving material to be acted upon by the high magnetic field. The body is substantially located within the primary magnetic field and shields the primary magnetic field from the hollow interior. A flux concentrator device is positioned within the hollow interior and has a slot extending the therethrough. The concentrator is coupled to the primary field for generating the strong magnetic field within the slot. Structure is provided to vary the size of the slot while a strong magnetic field is generated in the slot.

The invention and further developments of the invention are now elucidated by means of the preferred embodiments shown in the drawings:

FIG. 1 is a top view of a prior art flux concentrator;

FIG. 2 is a sectional view through 2—2 of FIG. 1;

FIG. 3 is a top view of a flux concentrator in accordance with the present invention;

FIG. 4 is a sectional view through 4—4 of FIG. 3;

FIG. 5 is a top view of a second embodiment of a flux concentrator in accordance with the present invention; and FIG. 6 is a sectional view through 6—6 of FIG. 5.

A flux concentrator 10 is provided for generating a strong magnetic field. The concentrator comprises an inductor 12 for generating a primary magnetic field which is weaker than the strong magnetic field. A concentrator body 14 has a hollow interior 16 for receiving material 18 to be acted upon by the strong magnetic field. The body 14 is located within the primary magnetic field and shields the primary magnetic field from the hollow interior. A flux concentrator 20 within the hollow interior has a slot 22 extending therethrough and forming a casting zone. The flux concentrator is coupled to the primary magnetic field for generating the strong magnetic field within the slot 22. The improvement comprises a device 24 for varying the size of the slot while the strong magnetic field is being generated in the slot.

Referring to FIG. 1, a flux concentrator as known in the prior art and described in the paper entitled "Flux Concentration by Stationary Conductors" by Howland and Foner is shown. The paper states that "This relatively high-conductivity structure acts as an 'eddy-current shield' when it is placed inside a coil in order to intensify, shape, and contain a magnetic field." A primary coil 28 is wound about a helical groove in conducting cylinder 30. The cylinder is provided with bores 32 and 34, a slot 36 and an orifice 38.

The principal of operation of the flux concentrator is illustrated in FIG. 1. The multi-turn coil 28 is attached to a conventional electrical generating device and a time varying current (indicated by arrows 40) is driven through the coil. In accordance with Faraday's law of induction, an opposing current (indicated by arrows 42) is induced in the concentrator 26. The current flows through the concentrator along the path of lowest impedance as illustrated. The induced current then creates a magnetic field in the slot 36 and orifice 38. The orifice 38 is designed as small as possible to maximize the magnetic flux density. The advantage of the flux concentrator is that many turns of the primary coil are linked to concentrate the field into a small region. Also, since energy losses occur in the various current carrying volumes including the air gap between the material and the slot, by reducing the size of the slot and/or orifice, these losses can be minimized.

The present invention is particularly concerned with an improved method and apparatus for electromagnetic casting of thin ribbon shapes. A typical prior art electromagnetic casting apparatus incorporating a concentrator is described in U.S. patent application Ser. No. 257,442. An alternating current is applied to the inductor and generates a magnetic field in a casting zone of the concentrator. This field interacts with the molten material within the zone to produce eddy currents therein. In turn, these eddy currents interact with the magnetic field and produce a magnetic pressure to contain the molten material as it solidifies with a desired cross section. During the casting process an air gap is created between the molten material and the surface of the slot or orifice of the concentrator. The molten material is formed in the casting zone with a cross section corresponding to the shape of the slot or orifice of the concentrator.

The present invention is also concerned with problems which might arise in the casting of semi-conductive materials such as silicon into ribbon with a very thin cross section on the order of 1 mm. To achieve containment conditions for shaping such thin ribbon, it is taught that very high AC frequencies would be required. The frequency required to provide a ribbon thicknesses of approximately 0.5 to 2 mm would be approximately 2 to 10 megahertz. Use of such high frequency results in thin conductive paths and extremely high power consumption.

For a given frequency, the power utilized is roughly proportional to the length of the ribbon over which the current is induced. The induced current per unit height (J) required for the containment of a molten head (h) is proportional to $h^{\frac{1}{2}}$:

$$J \alpha h^{\frac{1}{2}}$$

Thus, the total current (I) induced over a ribbon length (L) is proportional to L:

$$I \alpha h^{\frac{1}{2}} L$$

The resistance (R) of the silicon is inversely proportional to L:

$$R \alpha L^{-1}$$

Power consumption is given by $I^2 R$:

$$P \alpha (h^{\frac{1}{2}} L)^2 L^{-1} \text{ or } hL$$

That is, as stated above, the power absorbed is proportional to the length of the ribbon over which the current is induced. Accordingly, from the point of view of power consumption, the field should be concentrated over as short a length of the ribbon as possible consistent with shape control. The present invention provides for decreased high frequency power consumption and increased operating efficiency.

The present invention is particularly advantageous in the electromagnetic casting of very thin ribbon having thickness in the order of approximately 1 mm and a width in the order of approximately 100 mm. However, it is within the scope of the invention to use any sized ribbon as well as other cross-sectional configurations. With a thin ribbon, the slot or orifice in the concentrator, see FIG. 1, is preferably slightly larger than the thin ribbon. The resulting small gap minimizes the required magnetic flux and increases the efficiency of the concentrator. Unfortunately, a very small orifice requires costly precision machining. Also, it may be very difficult to start casting a ribbon of material through a very small orifice or slot.

The flux concentrator of the present invention can substantially alleviate these problems which exist in the prior art concentrators. The flux concentrator 10, as shown in FIGS. 3, and 4 includes a concentrator body 14 having a hollow interior 16. The concentrator body has an outer surface 44 and an inner surface 46. Both the inner and outer surfaces 46 and 44, respectively, are illustrated as being substantially cylindrical and formed about a centerline 47. It is, however, within the scope of the present invention to form the inner and/or outer surface in any desired shape, such as for example, oval or rectangular. The concentrator body may also include a helical groove 48 with an inner wall 49 which preferably conforms to the shape of inner surface 46.

A flux concentrator 20 is positioned within the hollow interior 16 of the concentrator body and has an orifice 22 extending therethrough. The flux concentrator may be joined to the inner surface 40 of concentrator body 14 by unitary construction or any other conventional means such as welding or brazing. The flux concentrator of the present invention, see FIG. 4, has inner walls 50 and 52 defining a slot 22. Curved surfaces 54 extend from the inner opposed walls 50 and 52 to the internal cylindrical surface 46 of the concentrator body. The shape of the surface between the inner walls 50 and 52 and the concentrator body is determined by the flux concentration for the cast material. For example, the wall 54 may be a tapered surface or a disc-like shape as described in a second embodiment of the present invention. Also, the walls may be positioned so that the slot walls are positioned anywhere along centerline 47.

An important aspect of the present invention is the provision of a slot 22 which splits the concentrator body and flux concentrator into at least two sections 56 and 58. A portion of the slot, i.e. the surfaces 50 and 52, is associated with each of the sections 56 and 58, respectively. It is also within the scope of the present invention to divide the body and concentrator into any number of sections as required.

An inductor 12 generates a primary magnetic field which is weaker than the strong magnetic field in the slot 22. The inductor is preferably a helical coil positioned in groove 48. To minimize losses of flux and increase the efficiency of the concentrator, the inductor is preferably rectangular in cross section and as close to the groove 48 as possible without actual physical contact. It may be desirable to place an insulating material about the coil to prevent it short-circuiting by contacting the concentrator body. It is also within the scope of the present invention to provide an inductor coil of any desired cross section, such as for example circular, oblong or square, as required to provide the desired flux concentration. The inductor as illustrated in FIG. 4 has five turns; however, it is within the scope of the invention to provide any desired number of turns. A conventional power source (not shown) delivers a time varying current to the coil.

The present invention includes a device for varying the size of the slot while a strong magnetic field is being generated in the slot. As seen in FIGS. 3 and 4, the size varying device may be a threaded rod 60 which is affixed at one end 62 to the outer surface 44 of the concentrator body. The rod passes through the stationary end supports 64 and 66. A threaded wheel 68 is positioned between the end supports and threaded on the rod 60. By turning the wheel, the rod is moved towards or away from the centerline 47. This movement changes the size of the slot as section 58 is positioned with respect to section 56. The size varying device, which includes the slot, may be replaced by any other conventional mechanism for moving one section of the concentrator with respect to the other section.

Another important aspect of the present invention is to use a concentrator with as high a conductivity as possible. To increase the conductivity, it may be desirable to silver-plate the concentrator. The plating thickness should be at least one penetration depth where $$\frac{1}{\delta} = \sqrt{\omega \sigma \mu_o}$$

with $\delta$=penetration depth, w=angular frequency, c=electrical conductivity, $\mu_o$=magnetic permeability.

In order to more fully understand the present invention, a description of its operation follows. A primary magnetic field is generated by driving a time varying current through an inductor 12 as indicated by arrows 70, see FIG. 3. The inductor generates a primary magnetic field in the concentrator body 14 which in turn induces an opposing current in the flux concentrator 20, indicated by arrows 72. The current flows through the concentrator along the shortest possible path as illustrated. Accordingly, the concentrator is preferably silver-plated to provide low resistance to the current flow and thereby increase its conductivity. The induced current indicated by arrows 72 creates a magnetic field in the slot 22 to generate a strong magnetic field in response to the primary magnetic field developed by the inductor. Thus, the plurality of turns of the primary coil are linked to the inductor body to concentrate the generated magnetic field into a small region, i.e. the slot. Next, the slot may be opened wider than required for steady state casting by adjusting the size varying device 24. The material 18 is received within the high magnetic field provided in the casting zone which may be defined as the length of the inner wall 50 of the slot in the direction of casting. The concentrator body acts to shield the primary magnetic field from the casting zone. After casting has begun, the wheel 68 may be turned to gradually decrease the width of the slot until the desired degree of flux is reached with the minimum of space between the walls 50, 52 and the material. It may be necessary to initially use higher current in the coil 12 and gradually decrease the current so as to maintain the flux constant within the slot 22. Although the above description primarily relates to casting, it is also within the terms of the present invention to use the concentrator for other operations such as reforming thin strip material.

A second embodiment of the flux concentrator is shown in FIGS. 5 and 6. The second embodiment has a structure which is very similar to the first embodiment and substantially identical structure is numbered as in the first embodiment but with the addition of a prime. The concentrator body is cylindrical and the concentrator 82 is disc-like and adjoined to the bottom portion of the concentrator body. A slot 84 separates the concentrator body and concentrator disc into two portions 86 and 88 similar to the first embodiment. The slot has an orifice 88. The second embodiment also has a size varying device 24'. The inductor 12' is positioned away from the outer surface of the concentrator body but may be embedded into a groove in the body as in the first embodiment. Although the disc is attached to the bottom portion of the body 80, it may be located anywhere within the inner surface of the body 80. The second embodiment also operates substantially the same as the first embodiment.

While the invention has been described generally by reference to semi-conductors and metals such as silicon or germanium, it may be adopted for use with any metals, alloys, and other metalloids as desired.

The patents and references set forth in this application are intended to be incorporated by reference herein.

It is apparent that there has been provided in accordance with this invention a flux concentrator which fully satisfies the objects, means, and advantages set forth hereinabove. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A process for generating a relatively strong magnetic field for casting a material comprising the steps of:
   generating a primary magnetic field being weaker than said strong magnetic field;
   receiving the material to be acted upon by said strong magnetic field in a casting zone;
   shielding said primary magnetic field from said casting zone;
   generating said strong magnetic field within said casting zone, the improvement comprising the step of:
   providing a concentrator body having a hollow interior for shielding said primary magnetic field; providing a flux concentrator within said hollow interior having a slot extending therethrough and forming said casting zone, said concentrator body and said flux concentrator being joined to each other and split into at least two sections; and moving one section with respect to the other section to vary the size of said slot while the strong magentic field is being generated in said casting zone.

2. A process as in claim 1 wherein said step of varying the size of said slot includes reducing the size of the slot as the casting proceeds.

3. A process as in claim 1 further including the step of providing said concentrator body and said flux concentrator with a highly conductive material plating.

4. A process as in claim 3 wherein said plating has a thickness of approximately one penetration depth.

5. A process as in claim 1 further including the step of providing said concentrator body with a helical groove around the outer surface of said concentrator body, said step of generating a primary magnetic field comprising the step of providing a helically coiled inductor disposed within said helical groove.

6. A process as in claim 1 including the step of providing said concentrator body from a body member having a substantially cylindrical outer surface, and
   said step of generating a primary magnetic field comprising the step of providing a helically coiled inductor disposed about said substantially cylindrical outer surface.

* * * * *